(12) United States Patent
Torek et al.

(10) Patent No.: US 8,283,112 B2
(45) Date of Patent: *Oct. 9, 2012

(54) PHOTORESIST PROCESSING METHODS

(75) Inventors: Kevin J. Torek, Meridian, ID (US);
Todd R. Abbott, Highland, UT (US);
Sandra Tagg, Boise, ID (US); Amy Weatherly, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/163,515

(22) Filed: Jun. 17, 2011

(65) Prior Publication Data
US 2011/0244404 A1  Oct. 6, 2011

Related U.S. Application Data

(63) Continuation of application No. 11/510,010, filed on Aug. 24, 2006, now Pat. No. 7,977,037.

(51) Int. Cl.
*G03F 7/26* (2006.01)
*G03F 7/38* (2006.01)

(52) U.S. Cl. ........................ 430/327; 430/326

(58) Field of Classification Search ............ 430/311, 430/322, 327, 326; 134/1.1
See application file for complete search history.

(56) References Cited

U.S. PATENT DOCUMENTS

| | | | |
|---|---|---|---|
| 4,579,623 A | 4/1986 | Suzuki et al. | |
| 4,617,252 A | 10/1986 | Cordes et al. | |
| 4,705,606 A | 11/1987 | Young et al. | |
| 4,886,728 A | 12/1989 | Salamy et al. | |
| 4,957,988 A | 9/1990 | Irving et al. | |
| 5,374,693 A | 12/1994 | Lynch et al. | |
| 5,641,541 A | 6/1997 | Chen | |
| 5,641,983 A | 6/1997 | Kato et al. | |
| 5,789,289 A | 8/1998 | Jeng | |
| 6,036,758 A | 3/2000 | Fairweather | |
| 6,174,816 B1 | 1/2001 | Yin et al. | |
| 6,276,273 B1 | 8/2001 | Aurenty et al. | |
| 6,361,921 B1 | 3/2002 | Thompson | |
| 6,418,356 B1 | 7/2002 | Oh | |
| 6,465,161 B1 | 10/2002 | Kang et al. | |
| 6,515,342 B1 | 2/2003 | Gupta et al. | |
| 7,977,037 B2 * | 7/2011 | Torek et al. | 430/327 |
| 2003/0228474 A1 | 12/2003 | Taylor et al. | |
| 2004/0202957 A1 | 10/2004 | Murota | |
| 2006/0042651 A1 | 3/2006 | Verhaverbeke et al. | |

FOREIGN PATENT DOCUMENTS
KR  2001057018 A  7/2001

OTHER PUBLICATIONS

DuPont Performance Chemicals, Zonyl FS-62, fluorosurfactant, Feb. 1998, 2 pages.
Wolf et al., "Silicon Processing for the VLSI Era", vol. 1, Process Technology, Second Edition, Lattice Press, Sunset Beach, CA, 1986, pp. 510-517.

* cited by examiner

*Primary Examiner* — Anca Eoff
(74) *Attorney, Agent, or Firm* — Well St. John, P.S.

(57) ABSTRACT

A photoresist processing method includes treating a substrate with a sulfur-containing substance. A positive-tone photoresist is applied on and in contact with the treated substrate. The method includes selectively exposing a portion of the photoresist to actinic energy and developing the photoresist to remove the exposed portion and to form a photoresist pattern on the substrate. The treating with a sulfur-containing substance reduces an amount of residual photoresist intended for removal compared to an amount of residual photoresist that remains without the treating.

23 Claims, 1 Drawing Sheet

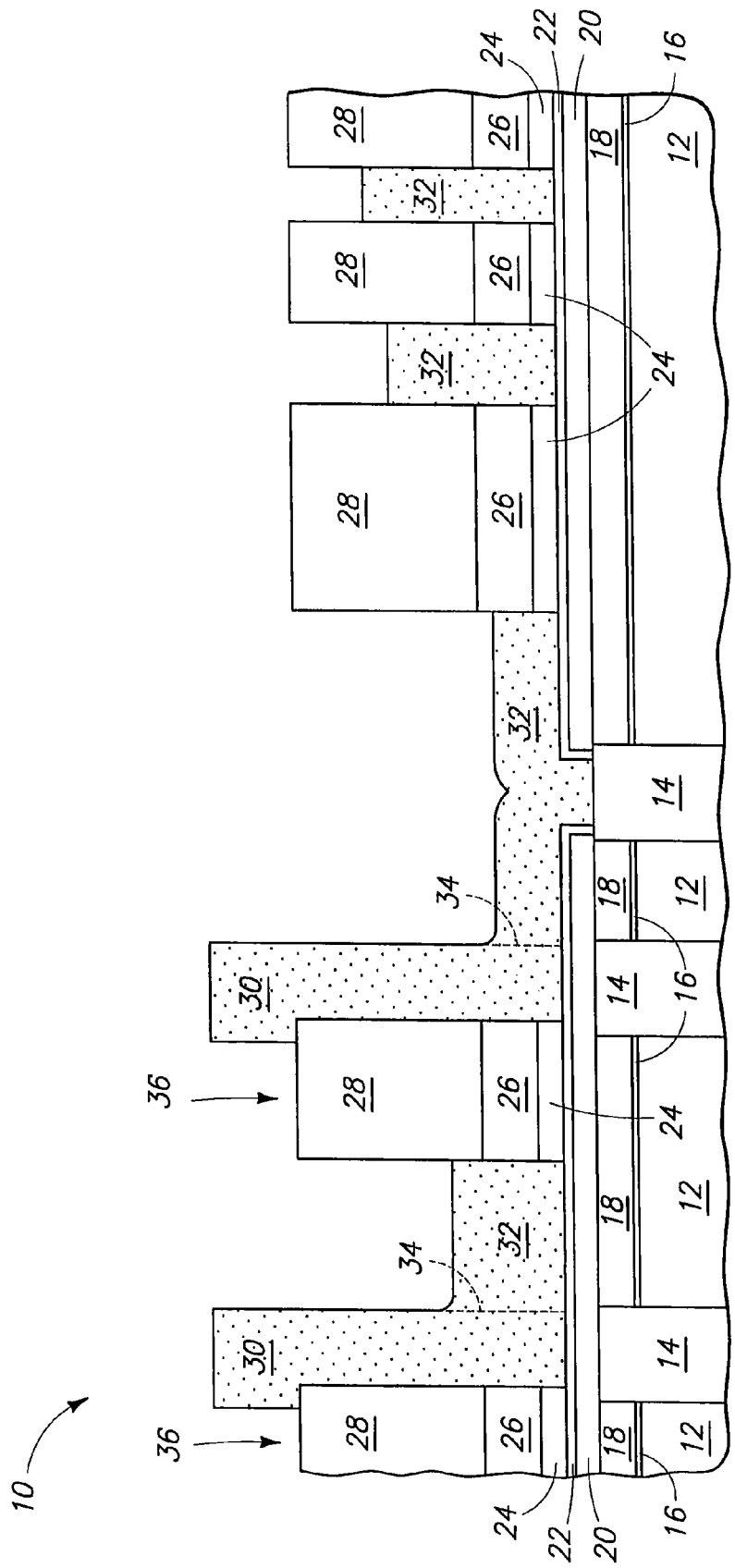

PHOTORESIST PROCESSING METHODS

RELATED PATENT DATA

This patent resulted from a continuation application of U.S. patent application Ser. No. 11/510,010, filed Aug. 24, 2006, entitled "Photoresist Processing Methods", naming Kevin J. Torek, Todd R. Abbott, Sandra Tagg, and Amy Weatherly as inventors, the disclosure of which is incorporated by reference.

TECHNICAL FIELD

The invention pertains to photoresist processing methods, including those using positive-tone photoresist.

BACKGROUND OF THE INVENTION

Lithographic processes are widely used to selectively mask a portion of a substrate, enabling processing of exposed portions of the substrate without affecting the lithographically masked portion. Photolithography uses a photoresist sensitive to actinic energy exposure. For a positive-tone photoresist, portions exposed to actinic energy are chemical modified as a result of the actinic energy exposure to become more soluble in a developer and are removed during subsequent development processing. Accordingly, interruptions in the chemical mechanism rendering the exposed portions more soluble may prevent removal of desired portions of a photoresist. Accordingly, discovery of residual photoresist portions intended for removal may warrant revision of standard processing techniques to accommodate special circumstances that generated the residue.

BRIEF DESCRIPTION OF THE DRAWINGS

Preferred embodiments of the invention are described below with reference to the following accompanying drawing.

The FIGURE is a partial sectional view of an intermediate memory construction showing residual photoresist intended for removal.

DETAILED DESCRIPTION OF THE PREFERRED EMBODIMENTS

Aspects of the invention described herein originated during, but are not limited to, fabrication of FLASH transistors used in NAND circuitry. The FIGURE shows a partial sectional view of integrated circuit 10 wherein the problem and its solution were discovered. Integrated circuit 10 includes a substrate 12, which may be a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Silicon oxide formed by high density plasma (HDP) processing forms active area isolation 14 in substrate 12. A layer of tunnel oxide 16 containing $SiO_2$ is formed over substrate 12 followed by a layer of lower polysilicon 18 and a layer of upper polysilicon 20. A floating gate may be formed in lower polysilicon 18 and upper polysilicon 20 in association with gate lines 36. A composite layer of gate dielectric 22 formed over upper polysilicon 20 separates the floating gate from gate lines 36 and may be formed from conventional oxide-nitride-oxide materials. A stack of materials forming gate line 36 includes a layer of gate polysilicon 24 as the control gate, a layer of tungsten silicide 26 as the gate conductor for programming a resulting memory cell, and a layer of silicon oxide 28. Silicon oxide 28 may be formed by chemical vapor deposition using tetraethylorthosilicate (TEOS).

Integrated circuit 10 is at an intermediate step in processing wherein certain portions are masked with photoresist to allow selective processing of unmasked portions. Accordingly, the FIGURE shows a photoresist 30 formed over portions of gate lines 36 and gate dielectric 22. Notably, the FIGURE also shows residual photoresist 32 intended for removal that remained after development processing. Dashed lines representing a resist boundary 34 to designate the portion of residual photoresist 32 intended for removal and the portion of photoresist 30 intending to remain as a mask.

As indicated above, aspects of the invention are not limited to the particular circumstances in which the problem and solution were discovered. Using the disclosure herein, those of ordinary skill may now appreciate other resist processing scenarios where a similar problem may occur and a similar solution may resolve observed defects in resist processing.

According to one aspect of the invention, a photoresist processing method includes treating a substrate with a sulfur-containing substance including a surfactant having a sulfo group, a sulfur-containing plasma, and/or dimethyl sulfoxide (DMSO). A positive-tone photoresist is applied on and in contact with the treated substrate. The method includes selectively exposing a portion of the photoresist to actinic energy and developing the photoresist to remove the exposed portion and to form a photoresist pattern on the substrate. The treating with a sulfur-containing substance reduces an amount of residual photoresist intended for removal compared to an amount of residual photoresist that remains without the treating.

By way of example, the surfactant that has a sulfo group may include $CF_3CF_2CF_2CF_2CF_2CF_2CH_2CH_2SO_3X$, where X is H or $NH_4$, available from E. I. DuPont de Nemours in Wilmington, Del. as ZONYL™ FS-62, an anionic fluorosurfactant. A sulfo group is also known as a sulfonic acid group typically represented as —$SO_2OH$ or —$SO_3H$. The sulfur-containing substance may also or instead include DMSO. The sulfur-containing substance may include sulfuric acid and hydrogen peroxide. The sulfur-containing substance may be applied as a liquid, for example, by spin-on application or bath immersion. An aqueous solution containing 0.02 to 3.0 volume percent (vol %) ZONYL™ FS-62 may be used, though a 0.1 vol % solution was demonstrated to achieve the advantages described below. An aqueous solution containing 0.1 to 100 vol % DMSO may be used, though a 1:10 DMSO:$H_2O$ by volume solution was demonstrated to achieve the other advantages described below. A conventionally known "piranha" etch solution contains sulfuric acid and hydrogen peroxide, namely, generally greater than 80 weight percent (wt %) sulfuric acid and at least some, but no more than 2 wt %, hydrogen peroxide with the remainder $H_2O$.

Although presently less preferable, a gaseous or a plasma sulfur-containing substance might be identified that also achieves the described advantages. $SO_2$ gas treatment was attempted, but did not achieve the same effect as bath immersion in a piranha etch solution, ZONYL™ FS-62 aqueous solution, or DMSO aqueous solution. Even so, it is expected that other sulfur-containing substances might be identified that could be used in gas and/or plasma treatment to achieve similar effects.

The substrate may include a plurality of adjacent gate lines containing silicon oxide over tungsten silicide over polysilicon, the gate lines being over a gate dielectric composite oxide-nitride-oxide layer which is exposed between the gate lines. The gate lines and exposed portions of the gate dielectric may be subjected to the treatment with a sulfur-containing substance. Although the reason why aspects of the invention described herein achieve the desired effect have not yet been determined, observation indicates that the topography and/or chemical composition of the substrate on which the positive-tone photoresist is applied appears to play a role in producing the residual photoresist intended for removal. Substrates with a different topography and/or chemical composition do not produce residual photoresist when processed in a similar fashion. Also, negative photoresists investigated thus far do not produce residual photoresist. However, integrated circuit 10 shown in the FIGURE clearly yields the problem of residual photoresist when a positive-tone, deep-UV photoresist available from Shin-Etsu MicroSi, Inc. in Phoenix, Ariz. known as SEPR-402 is used. Also, aspects of the invention clearly resolve the residual photoresist problem.

A suitable solvent developer includes conventional tetramethyl ammonium hydroxide (TMAH) at a concentration of 1 to 3 wt % in $H_2O$ along with 100 to 300 parts per million (ppm) of a conventional surfactant. Although the mechanism involved in yielding residual photoresist is not well understood, it is possible that the residual resist may be related to use of TMAH. The aspects of the invention allowed continued use of existing development processes without forcing replacement of TMAH by other less well known or effective developers.

The photoresist processing method may further include rinsing excess sulfur-containing substance from the substrate, if an excess amount is present, and applying the photoresist after the rinsing. Generally, $H_2O$ may be used for rinsing, however, other rinse agents may be warranted depending upon the sulfur-containing substance applied.

Also, the method may further include, after treating the substrate, priming the substrate with an adhesion primer different from the sulfur-containing substance and applying the photoresist after the priming. Use of adhesion primers is generally known to those of ordinary skill and hexamethyl disilazane is a suitable primer. Notably, use of HMDS for adhesion priming without treatment using a sulfur-containing substance still produces the problem of residual photoresist. Accordingly, observation indicated that conventional adhesion priming techniques may be distinguished from aspects of the present invention.

Further, the photoresist processing method may include treating the substrate with a liquid containing sulfuric acid and hydrogen peroxide before treating with the sulfur-containing substance. That is, in the circumstances where a sulfur-containing substance includes other than sulfuric acid and hydrogen peroxide, such as a piranha etch solution, it may be advantageous to provide two treatment steps. The first step may use a piranha etch solution and the second step may use a different sulfur-containing substance.

In addition to treatment with a sulfur-containing substance, the time delay from the time the photoresist is applied up to soft baking (or pre-baking or post-apply baking) can also influence elimination of residual photoresist. Accordingly, the photoresist processing method may include soft baking the photoresist after a delay of less than five minutes from the time the photoresist was applied, a maximum time delay depending upon the sulfur-containing substance selected. Observation indicated that soft baking the photoresist after a delay of less than ten seconds from the time the photoresist was applied was sufficient to reduce defects caused by residual photoresist. The defect reduction was equivalent to that obtained from a two-tank bath immersion in a piranha etch solution. Unfortunately, some tools and processing schedules preclude a less than or equal to ten second delay.

Treatment with a sulfur-containing liquid including sulfuric acid and hydrogen peroxide improved the maximum time delay to about 20 seconds. Treatment with a 1:10 DMSO:$H_2O$ by volume solution improved the maximum time delay to about three minutes. Treatment with a 0.1 vol % aqueous solution of ZONYL™ FS-62 improved the maximum time delay to about five minutes. Accordingly, a robust photoresist processing method that reduces the amount of residual photoresist intended for removal may further include designating a maximum time delay depending upon the sulfur-containing substance selected.

According to another aspect of the invention, a photoresist processing method includes treating a substrate with a sulfur-containing substance, the substrate including silicon oxide, tungsten silicide, and polysilicon all subjected to the treatment. A positive-tone photoresist is applied on and in contact with the treated silicon oxide, tungsten silicide, and polysilicon. The method includes selectively exposing a portion of the photoresist to actinic energy and developing the photoresist to remove the exposed portion and to form a photoresist pattern on the substrate. The treating reduces an amount of residual photoresist intended for removal compared to an amount of residual photoresist that remains without the treating.

By way of example, the sulfur-containing substance may contain a surfactant having a sulfo group, a sulfur-containing plasma, sulfuric acid, and/or dimethyl sulfoxide. The particular compositions and physical states for sulfur-containing substances described above may be used. Also, the substrate may exhibit the particular topographical features and compositions described above. Further, other additional features of the photoresist processing method described above may be incorporated. Still further, in the circumstance wherein the sulfur-containing substance includes sulfuric acid and hydrogen peroxide, the method may include additionally treating the treated substrate with a surfactant having sulfo group, a sulfur-containing plasma, and/or DMSO.

According to a further aspect of the invention, a photoresist processing method includes treating a substrate with a sulfur-containing liquid including a surfactant having a sulfo group, sulfuric acid, and/or DMSO. The substrate includes a plurality of adjacent gate lines containing silicon oxide over tungsten silicide over polysilicon, the gate lines being over a gate dielectric composite oxide-nitride-oxide layer which is exposed between the gate lines. The gate lines and the exposed portions of the gate dielectric are subjected to the treatment. If an excess amount of the sulfur-containing liquid is present, the method includes rinsing excess sulfur-containing liquid from the substrate. After the rinsing of excess sulfur-containing liquid, if any, the substrate is primed with an adhesion primer different from the sulfur-containing liquid. A positive-tone photoresist is applied on and in contact with the primed silicon oxide, tungsten silicide, polysilicon, and exposed gate dielectric. The photoresist is soft baked after a delay of less than five minutes from the time the photoresist was applied, a maximum time delay depending upon the sulfur-containing liquid selected. A portion of the soft-baked photoresist is selectively exposed to actinic energy and the photoresist is developed to remove the exposed portion and to form a photoresist pattern on the substrate. The treating reduces an amount of residual photoresist intended for removal compared to an amount of residual photoresist that remains without the treating. By way example, the sulfur-containing substances, maximum time delays, primer, and/or the additional treatment with a sulfur-containing substance more particularly described for the above aspects of the invention may be incorporated.

EXAMPLE 1

A silicon wafer including the intermediate memory construction shown in the FIGURE was processed by priming the construction with vapor deposition of HMDS, spin-on coating the primed construction with a SEPR-402 positive-tone photoresist, soft baking the photoresist at 102° C. for 90 seconds after a delay of from 10 seconds to 5 minutes from the time the photoresist was applied, selectively exposing a portion of the soft-baked photoresist through a reticle with 248 nm radiation, post-exposure baking the photoresist at 110° C. for 90 seconds, and developing the photoresist to remove the exposed portion and to form a photoresist pattern on the substrate. Two applications of 4262 Developer (available from Fujifilm Electronic Materials of North Kingstown, R.I.) were used, each with a 30 second dwell time. All photoresist processing was performed within the SEPR-402 manufacturer's specifications. Defect analysis revealed the large number of defects indicated in the Table in the "Control" column for Trial 1. Processing was repeated with another silicon wafer for Trial 2 shown in the Table. Trial 3 involved re-analyzing the Trial 2 wafer with the system optimized to detect residual photoresist. More than 99% of the defects for each trial were identified as residual photoresist.

Table of Examples 1-4 Results

| Trial | Control | Tool A | Tool B | Tool B (short rinse) |
|---|---|---|---|---|
| 1 | 51,544 | 85 | 73 | 94 |
| 2 | 11,147 | 22 | 44 | 23 |
| 3 | 22,977 | 113 | 123 | 112 |

EXAMPLES 2-4

The Example 1 trials were modified in Examples 2-4 by including two-tank bath immersion in a piranha etch solution before priming the construction. Example 2 was conducted in piranha Tool A while Examples 3 and 4 were conducted in piranha Tool B. Each of the two piranha tanks in both tools contained 90 wt % $H_2SO_4$, 3 wt % $H_2O_2$, and the remainder $H_2O$ controlled at 140° C. in the first tank and 120° C. in the second tank. The wafers were immersed for 10 minutes in each tank and then rinsed after removal from the second tank. Even though the data is not reported herein, it was discovered that the two 10 minute immersions produced less residual resist than two otherwise identical 5 minute immersions. Since Tool B had a more efficient rinse than Tool A, Example 4 decreased rinse time to less than the Example 2 and 3 rinse time. Defect analysis revealed a decreased number of defects indicated in the Table for Examples 2-4 respectively in the "Tool A," "Tool B," and "Tool B (short rinse)" columns for Trial 1. Processing was repeated with another silicon wafer for Trial 2 shown in the Table. Trial 3 involved re-analyzing the Trial 2 wafer with the system optimized to detect residual photoresist. Even though the data is not reported herein, it was discovered that the two 10 minute immersions extended the acceptable delay to 20 seconds between photoresist coating and soft baking. By comparison, the Example 1 process required a delay of less than 10 seconds to avoid residual resist.

EXAMPLES 5 and 6

Processing similar to that of Examples 2-4 was conducted for Examples 5 and 6 except that respective solutions of 1:10 DMSO:$H_2O$ by volume and 0.1 vol % ZONYL™ FS-62 in $H_2O$ were used instead of piranha etch solution. Also, solutions maintained at ambient (about 20° C.) were single wafer spin applied with a dwell time of 45 seconds to 1 minute before spinning off the solution. No rinsing occurred. In Example 6, the delay between photoresist coating and soft baking was 5 minutes. The decrease in residual resist defects was similar to that obtained for the piranha etch solution. In Example 6, no residual resist defects were identified. Additionally, the 1:10 DMSO:$H_2O$ by volume solution improved the coat-to-soft bake time delay to about 3 minutes. Treatment with a 0.1 vol % aqueous solution of ZONYL™ FS-62 improved the coat-to-soft bake time delay to about 5 minutes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A photoresist processing method comprising:
    treating a sidewall surface of a gate line with a sulfur-containing substance including a surfactant having a sulfo group and/or including dimethyl sulfoxide, the sidewall surface of the gate line comprising at least one of tungsten silicide and polysilicon;
    applying a positive-tone photoresist on and in contact with the treated sidewall surface of the gate line;
    selectively exposing a portion of the photoresist to actinic energy; and
    developing the photoresist to remove the exposed portion and to form a photoresist pattern on the substrate, the treating reducing an amount of residual photoresist intended for removal compared to an amount of residual photoresist that remains without the treating.

2. The method of claim 1 wherein the sulfur-containing substance comprises $CF_3CF_2CF_2CF_2CF_2CF_2CH_2CH_2SO_3X$, where X is H or $NH_4$.

3. The method of claim 2 wherein X is H.

4. The method of claim 2 wherein X is $NH_4$.

5. The method of claim 1 further comprising, if an excess amount of the sulfur-containing substance is present, rinsing excess sulfur-containing substance away and applying the photoresist after the rinsing.

6. The method of claim 1 further comprising, after the treating, priming the sidewall surface of the gate line with an adhesion primer different from the sulfur-containing substance and applying the photoresist after the priming.

7. The method of claim 1 further comprising soft baking the photoresist after a delay of less than 5 minutes from the time the photoresist was applied, a maximum time delay depending upon the sulfur-containing substance selected.

8. The method of claim 1 further comprising treating the sidewall surface of the gate line with a liquid containing sulfuric acid and hydrogen peroxide before treating with the sulfur-containing substance.

9. The method of claim 1 wherein the sulfur-containing substance comprises dimethyl sulfoxide.

10. The method of claim 1 wherein the sulfur-containing substance comprises a sulfo group.

11. The method of claim 1 wherein the sulfur-containing substance comprises a sulfo group and dimethyl sulfoxide.

12. A photoresist processing method comprising:
   treating a surface of a substrate with a sulfur-containing substance, the treated surface of the substrate including tungsten silicide and polysilicon each simultaneously subjected to the treatment in contact with the tungsten silicide and polysilicon;
   applying a positive-tone photoresist on and in contact with the treated tungsten silicide and polysilicon of the surface of the substrate;
   selectively exposing a portion of the photoresist to actinic energy; and
   developing the photoresist to remove the exposed portion and to form a photoresist pattern on the substrate, the treating reducing an amount of residual photoresist intended for removal compared to an amount of residual photoresist that remains without the treating.

13. The method of claim 12 wherein the sulfur-containing substance comprises a surfactant having a sulfo group, a sulfur-containing plasma, sulfuric acid, and/or dimethyl sulfoxide.

14. The method of claim 12 wherein the sulfur-containing substance comprises $CF_3CF_2CF_2CF_2CF_2CF_2CH_2CH_2SO_3X$, where X is H or $NH_4$.

15. The method of claim 14 wherein X is H.

16. The method of claim 14 wherein X is $NH_4$.

17. The method of claim 12 wherein the sulfur-containing substance comprises a sulfur-containing plasma.

18. The method of claim 12 wherein the sulfur-containing substance comprises sulfuric acid and hydrogen peroxide.

19. The method of claim 18 comprising additionally treating the treated surface of the substrate with a surfactant having a sulfo group, a sulfur-containing plasma, and/or dimethyl sulfoxide.

20. The method of claim 12 wherein the sulfur-containing substance comprises dimethyl sulfoxide.

21. The method of claim 12 wherein the sulfur-containing substance is a liquid.

22. A photoresist processing method comprising:
   treating a surface of a substrate with a sulfur-containing substance including $CF_3CF_2CF_2CF_2CF_2CF_2CH_2CH_2SO_3H$;
   applying a positive-tone photoresist on and in contact with the treated surface of the substrate;
   selectively exposing a portion of the photoresist to actinic energy; and
   developing the photoresist to remove the exposed portion and to form a photoresist pattern on the substrate, the treating reducing an amount of residual photoresist intended for removal compared to an amount of residual photoresist that remains without the treating.

23. A photoresist processing method comprising:
   treating a surface of a substrate with a sulfur-containing substance including $CF_3CF_2CF_2CF_2CF_2CF_2CH_2CH_2SO_3NH_4$;
   applying a positive-tone photoresist on and in contact with the treated surface of the substrate;
   selectively exposing a portion of the photoresist to actinic energy; and
   developing the photoresist to remove the exposed portion and to form a photoresist pattern on the substrate, the treating reducing an amount of residual photoresist intended for removal compared to an amount of residual photoresist that remains without the treating.

* * * * *

UNITED STATES PATENT AND TRADEMARK OFFICE
CERTIFICATE OF CORRECTION

| | | |
|---|---|---|
| PATENT NO. | : 8,283,112 B2 | Page 1 of 1 |
| APPLICATION NO. | : 13/163515 | |
| DATED | : October 9, 2012 | |
| INVENTOR(S) | : Kevin J. Torek et al. | |

It is certified that error appears in the above-identified patent and that said Letters Patent is hereby corrected as shown below:

On the face page, in field (74), in "Attorney, Agent, or Firm", in column 2, line 1, delete "Well" and insert -- Wells --, therefor.

Signed and Sealed this
Eighteenth Day of December, 2012

David J. Kappos
*Director of the United States Patent and Trademark Office*